US010312158B2

(12) United States Patent
Li et al.

(10) Patent No.: US 10,312,158 B2
(45) Date of Patent: Jun. 4, 2019

(54) METHOD FOR FORMING SEMICONDUCTOR DEVICE STRUCTURE WITH GATE STRUCTURE

(71) Applicant: Taiwan Semiconductor Manufacturing Co., Ltd., Hsinchu (TW)

(72) Inventors: Yi-Cheng Li, Yunlin County (TW); Chien-Hao Chen, Chuangwei Township, Yilan County (TW); Yung-Cheng Lu, Hsinchu (TW); Jr-Jung Lin, Hsinchu (TW); Chun-Hung Lee, Hsinchu (TW); Chao-Cheng Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 65 days.

(21) Appl. No.: 15/670,401

(22) Filed: Aug. 7, 2017

(65) Prior Publication Data

US 2019/0043763 A1 Feb. 7, 2019

(51) Int. Cl.
*H01L 21/8238* (2006.01)
*H01L 21/28* (2006.01)
(Continued)

(52) U.S. Cl.
CPC ................ *H01L 21/823857* (2013.01); *H01L 21/28008* (2013.01); *H01L 21/2815* (2013.01); *H01L 27/092* (2013.01); *H01L 27/10876* (2013.01); *H01L 29/66545* (2013.01); *H01L 29/66636* (2013.01); *H01L 29/7853* (2013.01)

(58) Field of Classification Search
CPC ........... H01L 21/823857; H01L 27/092; H01L 21/28008; H01L 27/10876; H01L 21/2815; H01L 29/66636
See application file for complete search history.

(56) References Cited

U.S. PATENT DOCUMENTS 6,362,511 B1 * 3/2002 Mizushima ..... H01L 21/823828 257/412
6,569,715 B1 * 5/2003 Forbes ................ H01L 29/6675 257/E21.412

(Continued)

OTHER PUBLICATIONS

U.S. Appl. No. 15/282,981, filed Sep. 30, 2016, Yu et al.

*Primary Examiner* — Yasser A Abdelaziez
(74) *Attorney, Agent, or Firm* — Birch, Stewart, Kolasch & Birch, LLP

(57) ABSTRACT

A method for forming a semiconductor device structure is provided. The method includes forming a first amorphous layer over a substrate. The substrate has a base portion and a first fin portion over the base portion, and the first amorphous layer covers the first fin portion. The method includes annealing the first amorphous layer to crystallize the first amorphous layer into a first polycrystalline layer. The method includes forming a second amorphous layer over the first polycrystalline layer. The method includes removing a first portion of the second amorphous layer and a second portion of the first polycrystalline layer under the first portion. The remaining second amorphous layer and the remaining first polycrystalline layer together form a first gate structure over and across the first fin portion.

20 Claims, 24 Drawing Sheets

I I'
T2 170
114d T1 T1 116d
114 116 140P
130
112
120

(51) Int. Cl.

| | |
|---|---|
| ***H01L 27/108*** | (2006.01) |
| ***H01L 29/66*** | (2006.01) |
| ***H01L 27/092*** | (2006.01) |
| ***H01L 29/78*** | (2006.01) |

(56) References Cited

U.S. PATENT DOCUMENTS 6,991,999 B2 * 1/2006 Fu ..................... H01L 21/28035 257/E21.197
2012/0061762 A1 * 3/2012 Cheng ................. H01L 21/2633 257/365
2013/0075824 A1 * 3/2013 Fukushima ....... H01L 21/28035 257/368

* cited by examiner

METHOD FOR FORMING SEMICONDUCTOR DEVICE STRUCTURE WITH GATE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1G-1 is a top view of the semiconductor device structure of FIG. 1G, in accordance with some embodiments.

FIG. 2B-1 is a top view of the semiconductor device structure of FIG. 2B, in accordance with some embodiments.

FIG. 2C-1 is a top view of the semiconductor device structure of FIG. 2C, in accordance with some embodiments.

FIG. 2C-2 is a perspective view of the semiconductor device structure of FIG. 2C, in accordance with some embodiments.

FIG. 2F-1 is a perspective view of the semiconductor device structure of FIG. 2F, in accordance with some embodiments.

FIG. 4B-1 is a top view of the semiconductor device structure of FIG. 4B, in accordance with some embodiments.

DETAILED DESCRIPTION

Figure 1A:
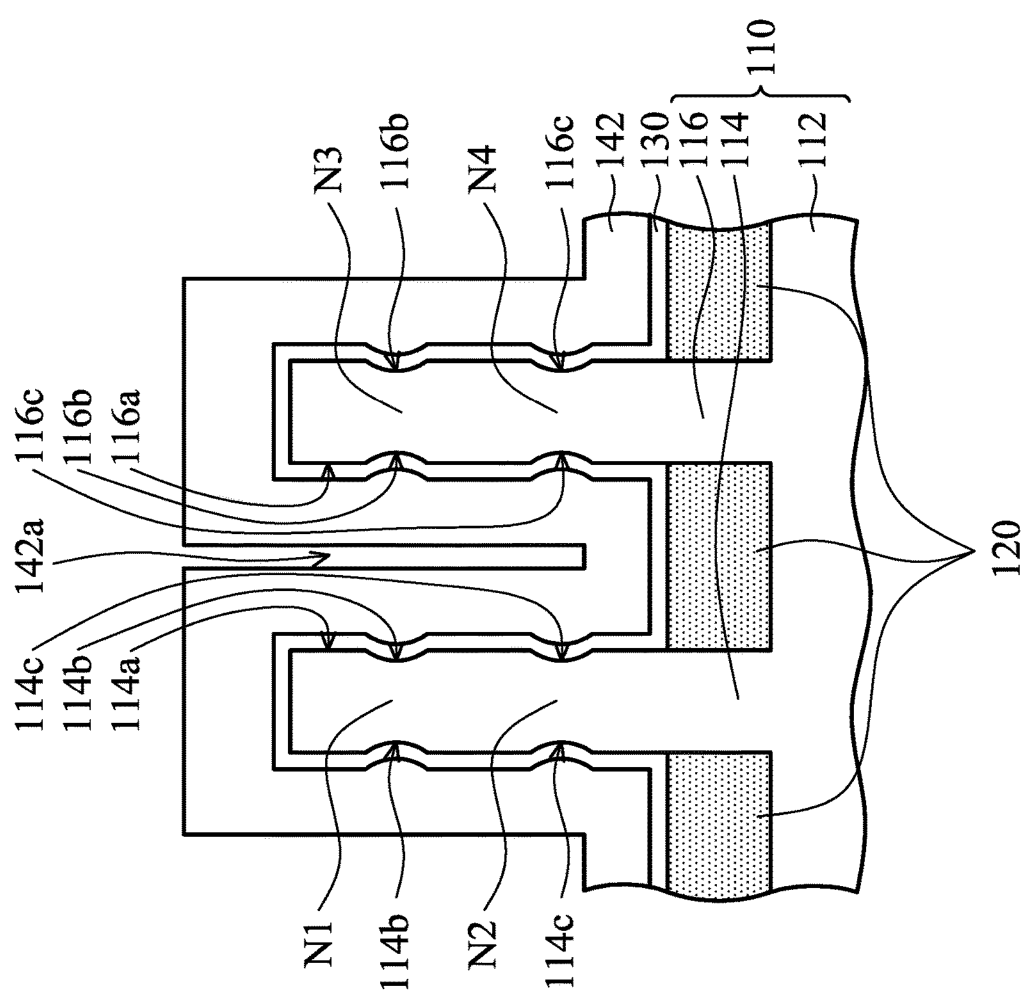
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1G are cross-sectional views of various stages of a process for forming a semiconductor device structure 200, in accordance with some embodiments.

As shown in FIG. 1A, a substrate 110 is provided, in accordance with some embodiments. The substrate 110 has a base portion 112 and fin portions 114 and 116, in accordance with some embodiments. The fin portions 114 and 116 are positioned over the base portion 112, in accordance with some embodiments.

The fin portion 114 has a sidewall 114*a*, in accordance with some embodiments. The sidewall 114*a* has recesses 114*b* and 114*c*, in accordance with some embodiments. The recess 114*b* surrounds a neck part N1 of the fin portion 114, in accordance with some embodiments. The recess 114*c* surrounds a neck part N2 of the fin portion 114, in accordance with some embodiments. Each neck part N1 or N2 is narrower than the other part of the fin portion 114, in accordance with some embodiments.

The fin portion 116 has a sidewall 116*a*, in accordance with some embodiments. The sidewall 116*a* has recesses 116*b* and 116*c*, in accordance with some embodiments. The recess 116*b* surrounds a neck part N3 of the fin portion 116, in accordance with some embodiments. The recess 116*c* surrounds a neck part N4 of the fin portion 116, in accordance with some embodiments. Each neck part N3 or N4 is narrower than the other part of the fin portion 116, in accordance with some embodiments.

The substrate 110 includes, for example, a semiconductor substrate. The semiconductor substrate includes, for example, a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, an isolation layer 120 is formed over the base portion 112 and surrounds the fin portions 114 and 116, in accordance with some embodiments. The fin portions 114 and 116 are partially embedded in the isolation layer 120, in accordance with some embodiments.

The isolation layer 120 includes oxide (such as silicon dioxide), in accordance with some embodiments. The isolation layer 120 is formed by a deposition process (e.g., a chemical vapor deposition process), a chemical mechanical polishing process, and an etching back process, in accordance with some embodiments.

Figure 5:
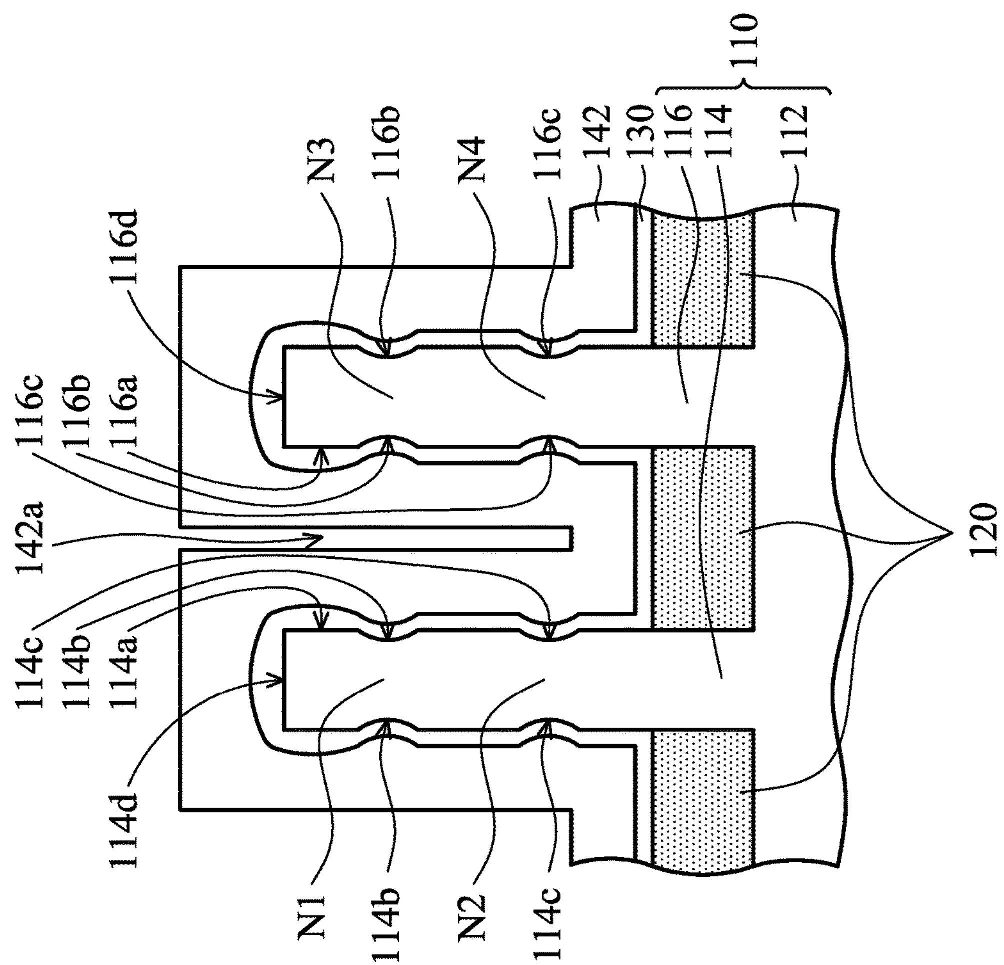
FIG. 5 is a cross-sectional view of a semiconductor device structure, in accordance with some embodiments.

As shown in FIG. 1A, a gate dielectric layer 130 is formed over the fin portions 114 and 116 and the isolation layer 120, in accordance with some embodiments. The gate dielectric layer 130 is in direct contact with the fin portions 114 and 116 and the isolation layer 120, in accordance with some embodiments. The gate dielectric layer 130 conformally covers the fin portions 114 and 116 and the isolation layer 120, in accordance with some embodiments. In some other embodiments, as shown in FIG. 5, the gate dielectric layer 130 adjacent to top surfaces 114*d* and 116*d* of the fin portions 114 and 116 is thicker than the gate dielectric layer 130 adjacent to the isolation layer 120, in accordance with some embodiments.

As shown in FIG. 1A, an amorphous material layer 142 is deposited over the substrate 110 and the isolation layer 120 to cover the fin portions 114 and 116, in accordance with some embodiments. The amorphous material layer 142 has a trench 142*a* between the fin portions 114 and 116, in accordance with some embodiments.

The amorphous material layer 142 includes a semiconductor material, such as Si, SiGe, or Ge, in accordance with some embodiments. The deposition process includes a chemical vapor deposition (CVD) process, such as a low pressure chemical vapor deposition (LPCVD) process or a plasma enhanced chemical vapor deposition (PECVD) process, in accordance with some embodiments. The deposition temperature of the deposition process ranges from about 350° C. to about 550° C., in accordance with some embodiments.

Figure 1B:
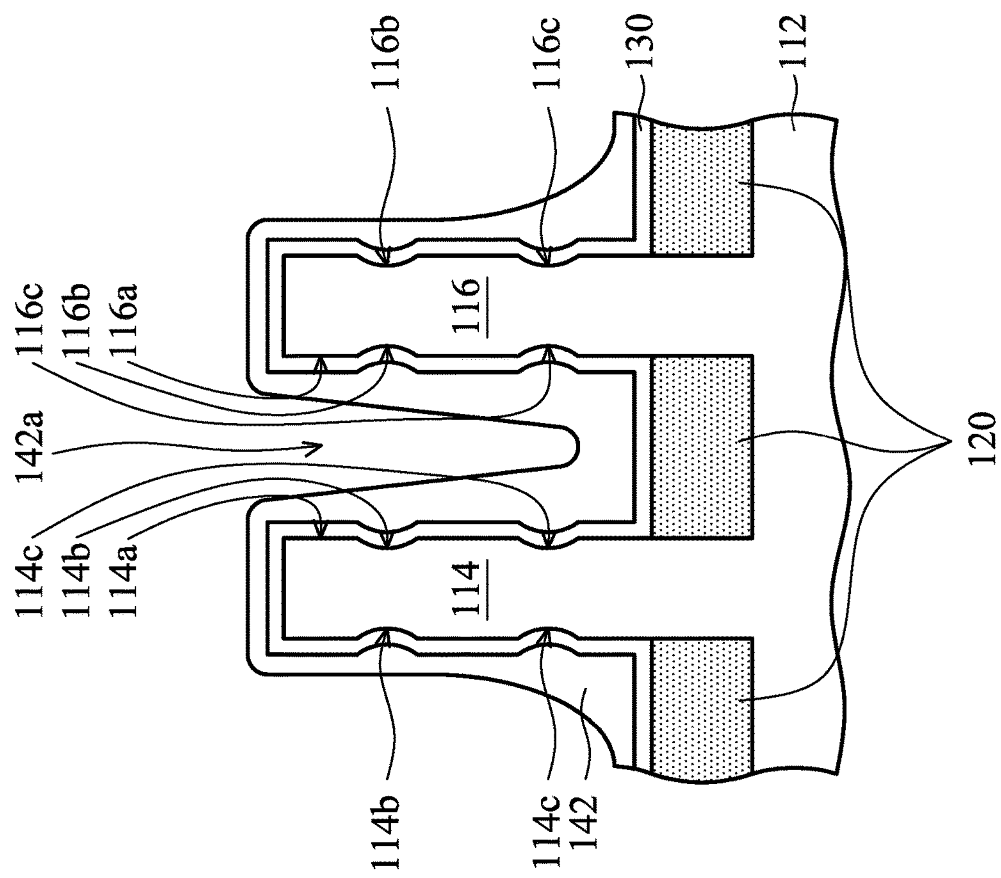

As shown in FIG. 1B, a portion of the amorphous material layer 142 between the fin portions 114 and 116 is removed to enlarge the width of the trench 142*a*, in accordance with some embodiments. After the removal process, the trench 142*a* becomes a V-shaped trench, in accordance with some embodiments. Since the width of the trench 142*a* is enlarged and the trench 142*a* becomes the V-shaped trench, it becomes easier to fill an amorphous material into the trench 142*a*, in accordance with some embodiments. The removal process includes an etching process, such as a dry etching or a wet etching process, in accordance with some embodiments. The etching process may use $Cl_2$, HCl, and/or HBr.

Figure 1C:
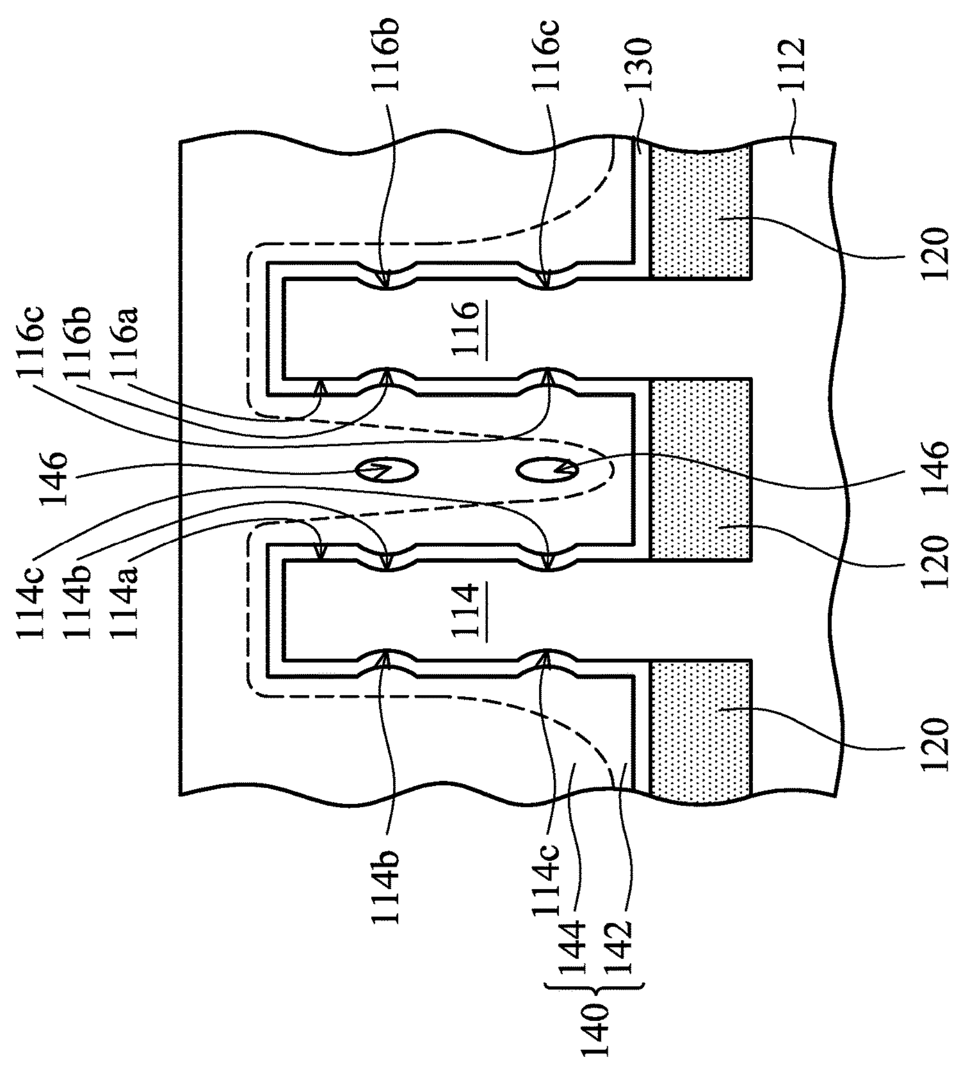

As shown in FIG. 1C, an amorphous material layer 144 is formed over the amorphous material layer 142, in accordance with some embodiments. The amorphous material layers 142 and 144 are made of the same material, in accordance with some embodiments. Therefore, the boundary between the amorphous material layers 142 and 144 is shown by a dotted line, in accordance with some embodiments.

The amorphous material layer 144 includes a semiconductor material, such as Si, SiGe, or Ge, in accordance with some embodiments. The amorphous material layer 144 is formed by alternately performing a deposition process and an etching process one or more times, in accordance with some embodiments. The deposition process includes a chemical vapor deposition (CVD) process, such as a low pressure chemical vapor deposition (LPCVD) process or a plasma enhanced chemical vapor deposition (PECVD) process, in accordance with some embodiments. The deposition temperature of the deposition process ranges from about 350° C. to about 550° C., in accordance with some embodiments. The etching process includes a dry etching and/or a wet etching process, in accordance with some embodiments.

The amorphous material layers 142 and 144 together form an amorphous layer 140, in accordance with some embodiments. The amorphous layer 140 is also referred to as a semiconductor layer, in accordance with some embodiments. The amorphous layer 140 covers the fin portions 114 and 116, in accordance with some embodiments. The amorphous layer 140 has voids 146 (and/or seams) between the recesses 114*b* and 116*b* and between the recesses 114*c* and 116*c*, in accordance with some embodiments. The voids 146 may be the result of broken bonds of the semiconductor material constituting the amorphous layer 140. The amorphous layer 140 has a first average grain diameter, in accordance with some embodiments.

Figure 1D:
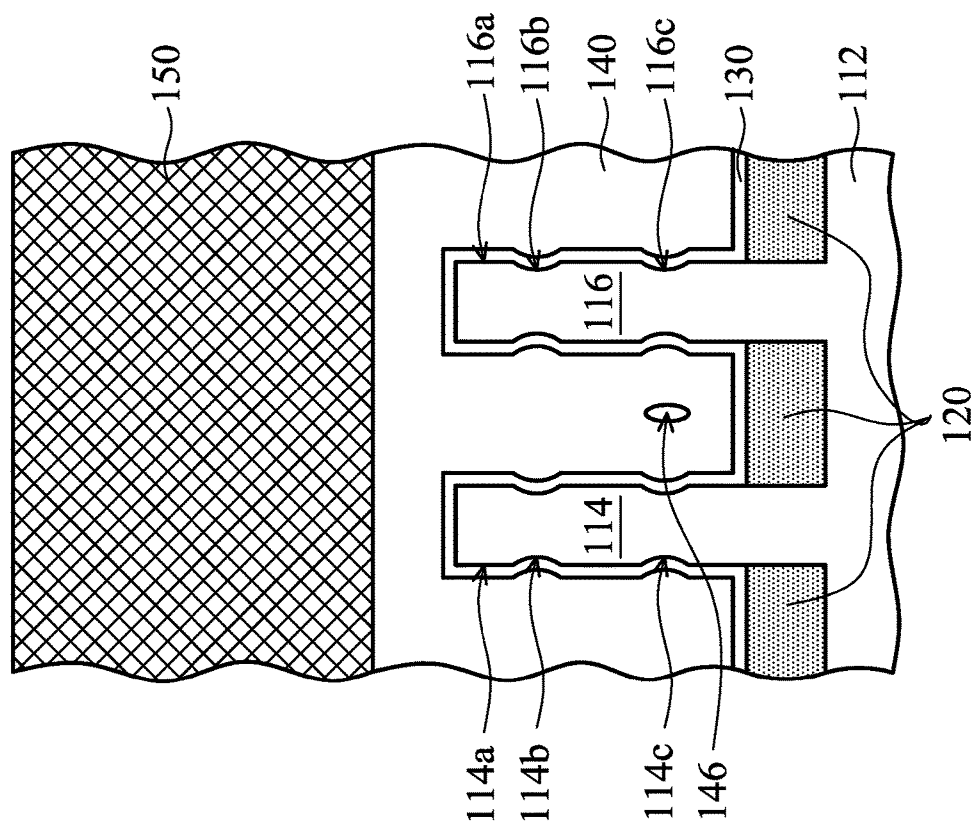

As shown in FIG. 1D, a polycrystalline layer 150 is formed over the amorphous layer 140, in accordance with some embodiments. The polycrystalline layer 150 includes a semiconductor material, such as Si, SiGe, or Ge, in accordance with some embodiments. The amorphous layer 140 and the polycrystalline layer 150 are made of the same material, in accordance with some embodiments.

The polycrystalline layer 150 is formed using a chemical vapor deposition (CVD) process, such as a low pressure chemical vapor deposition (LPCVD) process or a plasma enhanced chemical vapor deposition (PECVD) process, in accordance with some embodiments. The deposition temperature of the deposition process ranges from about 600° C. to about 650° C., in accordance with some embodiments.

The deposition temperature of the polycrystalline layer 150 is greater than that of the amorphous layer 140, in accordance with some embodiments. Therefore, the flowability of the amorphous layer 140 may be improved by the deposition process of the polycrystalline layer 150. Some of the broken bonds of the semiconductor material constituting the amorphous layer 140 may be repaired during the deposition process of the polycrystalline layer 150. As a result, some of the voids 146 (or seams) shrink or disappear after the deposition process of the polycrystalline layer 150, in accordance with some embodiments. In some other embodiments, the polycrystalline layer 150 is not formed.

Figure 1E:
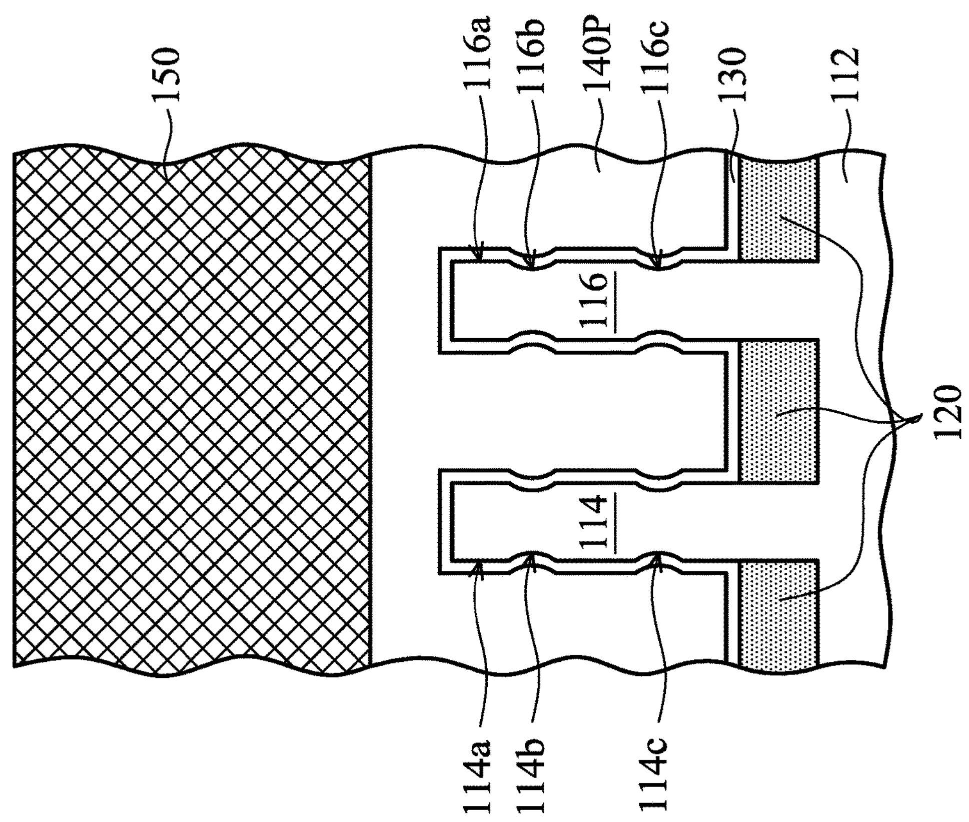

As shown in FIG. 1E, an annealing process is performed on the amorphous layer 140, in accordance with some embodiments. The first average grain diameter of the amorphous layer 140 is enlarged by the annealing process, in accordance with some embodiments. The amorphous layer 140 is crystallized into a polycrystalline layer 140P by the annealing process, in accordance with some embodiments. The annealing temperature of the annealing process is greater than about 600° C., in accordance with some embodiments. The annealing temperature of the annealing process ranges from about 600° C. to about 1000° C., in accordance with some embodiments.

The annealing temperature of the annealing process is greater than the deposition temperature of the amorphous layer 140, in accordance with some embodiments. Therefore, the flowability of the amorphous layer 140 may be improved by the annealing process. Some of the broken bonds of the semiconductor material constituting the amorphous layer 140 may be repaired during the annealing process. As a result, most of or all of the voids 146 (or seams) shrink or disappear after the annealing process, in accordance with some embodiments.

Since the polycrystalline layer 150 may provide a lot of seeds to the amorphous layer 140 adjacent to the polycrystalline layer 150 during the annealing process, the formation of the polycrystalline layer 150 may reduce the average grain diameter of the polycrystalline layer 140P, in accordance with some embodiments. If the average grain diameter of the polycrystalline layer 140P is smaller, the etching yield of the polycrystalline layer 140P will be better. Therefore, the formation of the polycrystalline layer 150 may improve the etching yield of the polycrystalline layer 140P during subsequent etching processes.

Figure 1F:
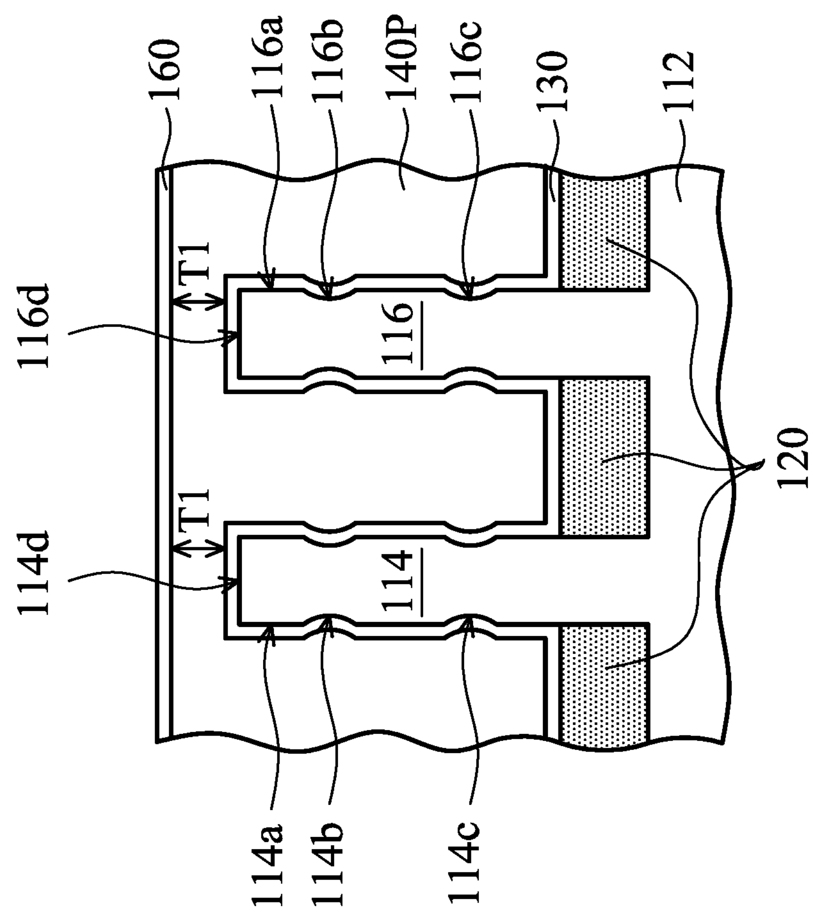

As shown in FIG. 1F, the polycrystalline layer 150 and an upper portion of the polycrystalline layer 140P are removed, in accordance with some embodiments. The removal process includes a chemical mechanical polishing process and/or an etching back process, such as a dry etching process, in accordance with some embodiments. After the removal process, a thickness T1 of the polycrystalline layer 140P over the top surfaces **114*d* and 116*d* of the fin portions 114 and 116** ranges from about 3 nm to about 20 nm, in accordance with some embodiments.

As shown in FIG. 1F, after the removal process, a semiconductor oxide layer 160 is formed over the polycrystalline layer 140P, in accordance with some embodiments. The semiconductor oxide layer 160 is a native oxide layer, in accordance with some embodiments.

Figure 1G:
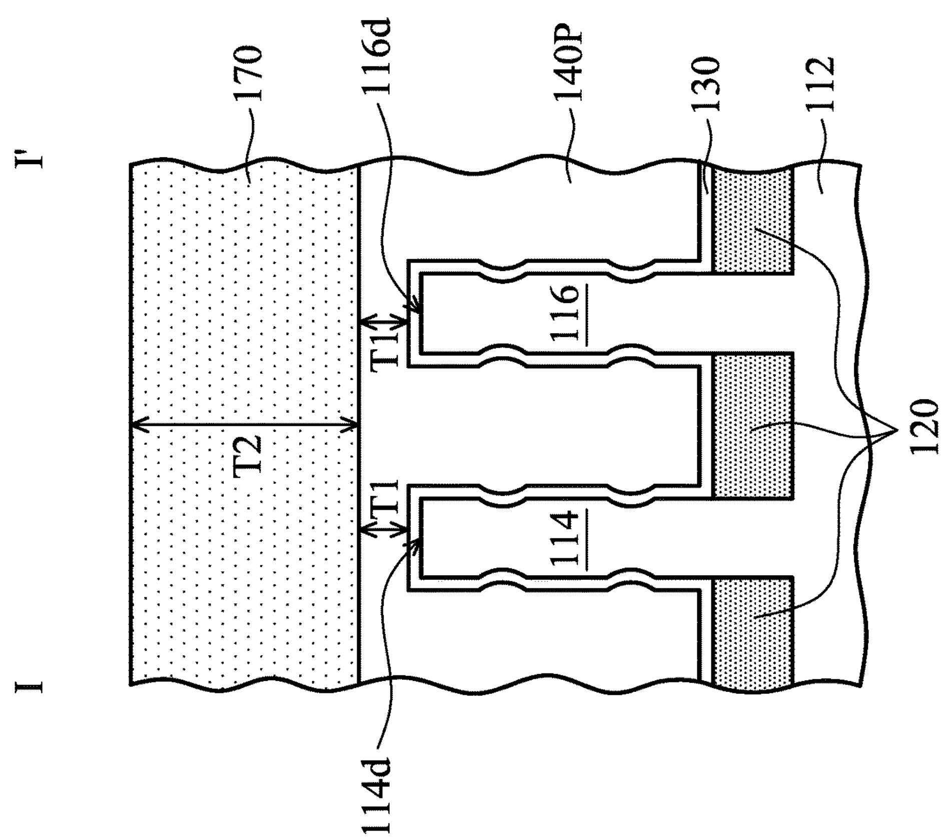

As shown in FIG. 1G, the semiconductor oxide layer 160 is removed, in accordance with some embodiments. The removal process includes an etching process, such as a dry etching process and/or a wet etching process, in accordance with some embodiments.

Figures 1, 1G:
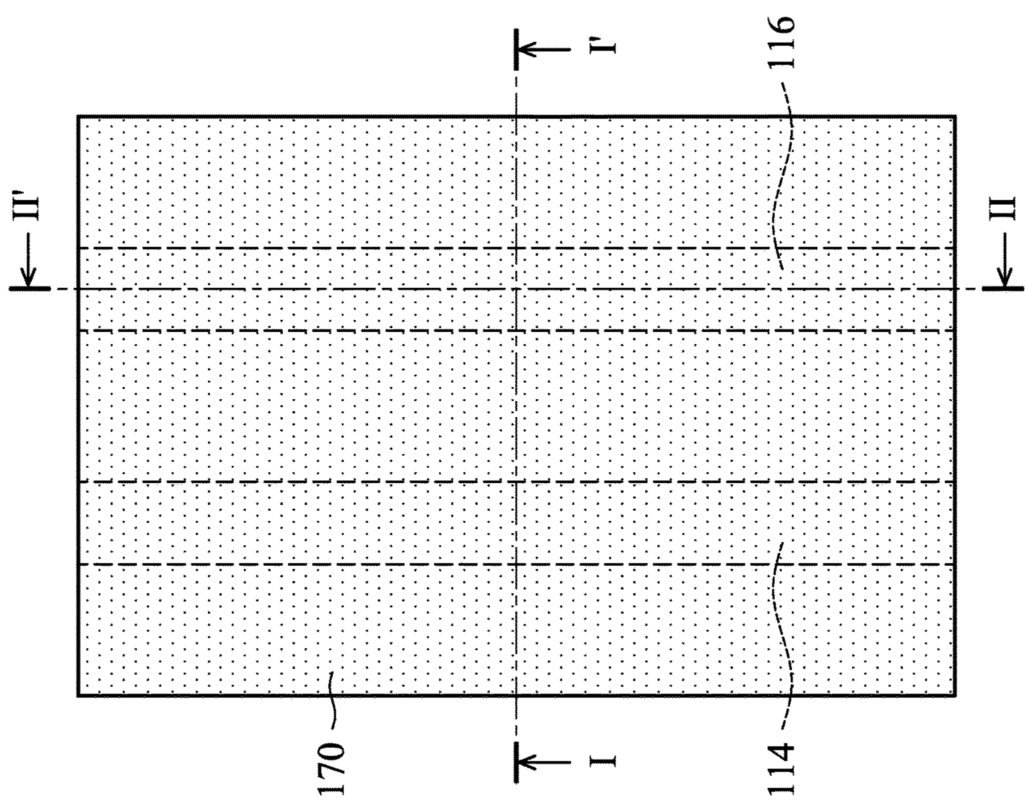
Figure 2A:
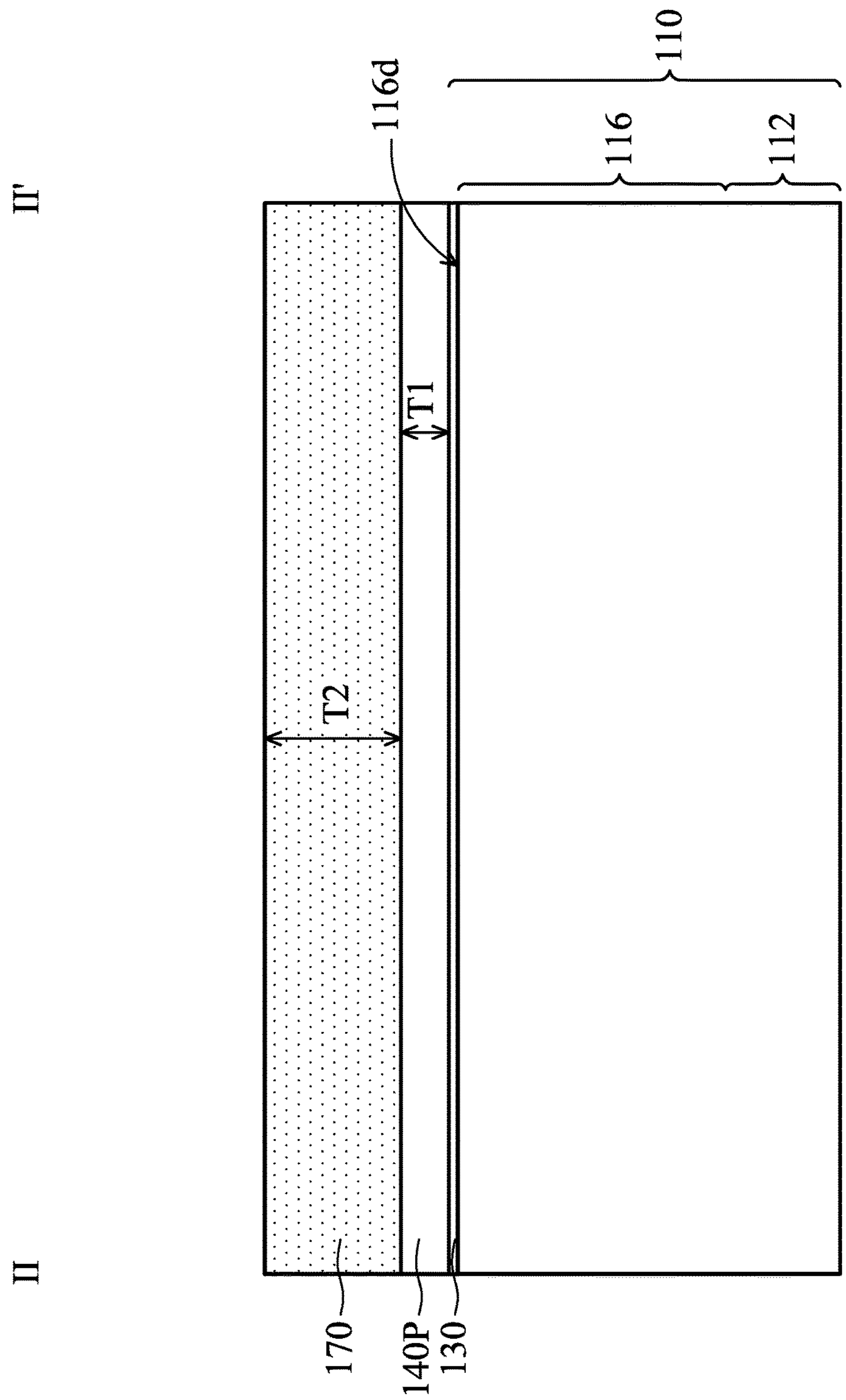
FIGS. 2A-2F are cross-sectional views of various stages of a process for forming the semiconductor device structure after the step of FIG. 1F, in accordance with some embodiments.

FIG. 1G-1 is a top view of the semiconductor device structure of FIG. 1G, in accordance with some embodiments. FIG. 2A is a cross-sectional view illustrating the semiconductor device structure along a sectional line II-II' in FIG. 1G-1, in accordance with some embodiments. As shown in FIGS. 1G, 1G-1, and 2A, an amorphous layer 170 is formed over the polycrystalline layer 140P, in accordance with some embodiments. The amorphous layer 170 is also referred to as a semiconductor layer, in accordance with some embodiments.

The amorphous layer 170 is in direct contact with the polycrystalline layer 140P, in accordance with some embodiments. The thickness T1 of the polycrystalline layer 140P over the top surface **116*d* is less than a thickness T2 of the amorphous layer 170, in accordance with some embodiments. An average grain diameter of the amorphous layer 170 is less than an average grain diameter of the polycrystalline layer 140**P, in accordance with some embodiments.

The amorphous layer 170 includes a semiconductor material, such as Si, SiGe, or Ge, in accordance with some embodiments. The amorphous layer 170 and the polycrystalline layer 140P are made of the same material, in accordance with some embodiments. The amorphous layer 170 is formed using a chemical vapor deposition (CVD) process, such as a low pressure chemical vapor deposition (LPCVD) process or a plasma enhanced chemical vapor deposition (PECVD) process, in accordance with some embodiments. The deposition temperature of the deposition process ranges from about 350° C. to about 550° C., in accordance with some embodiments.

Figure 2B:
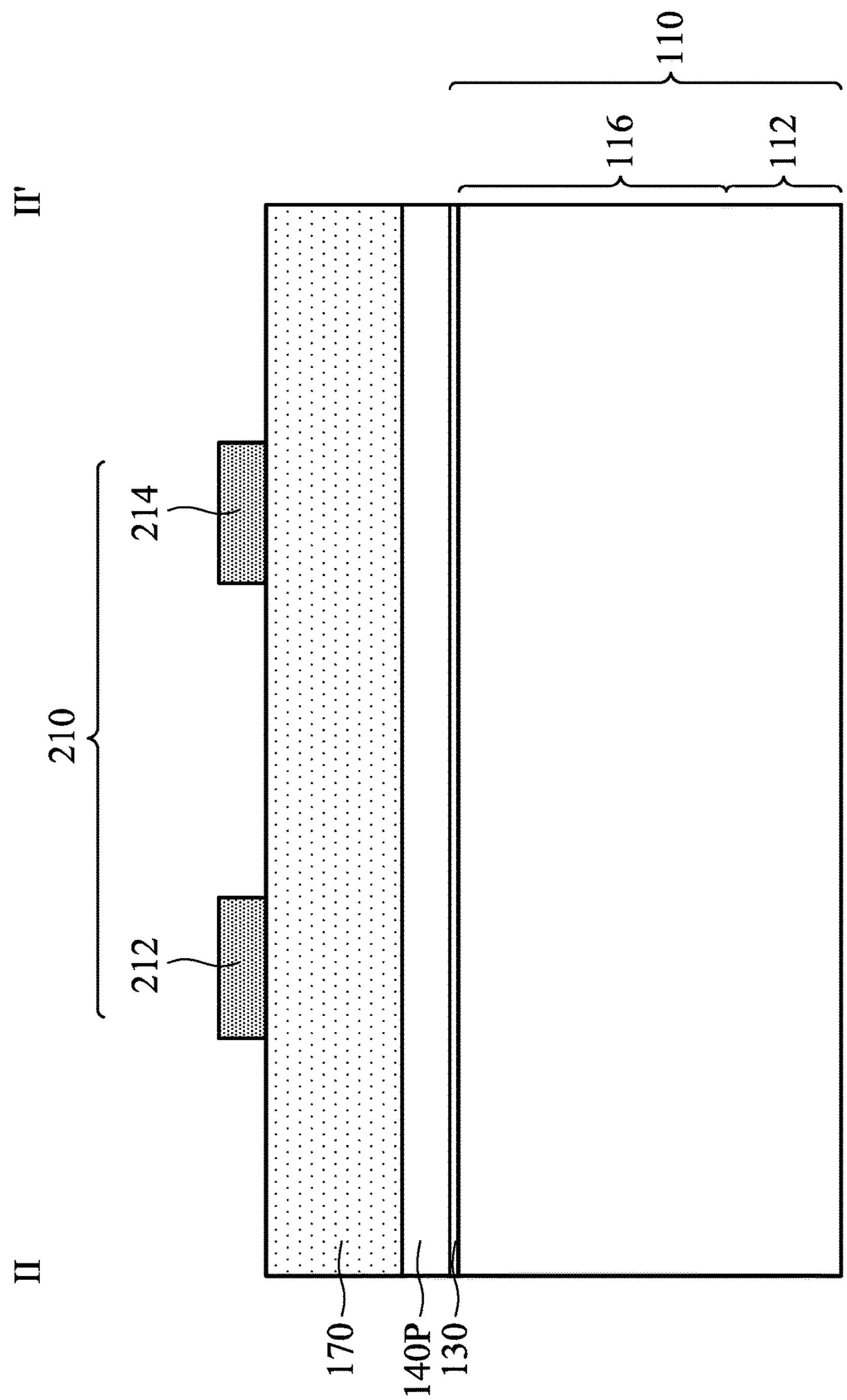
Figures 1, 2B:
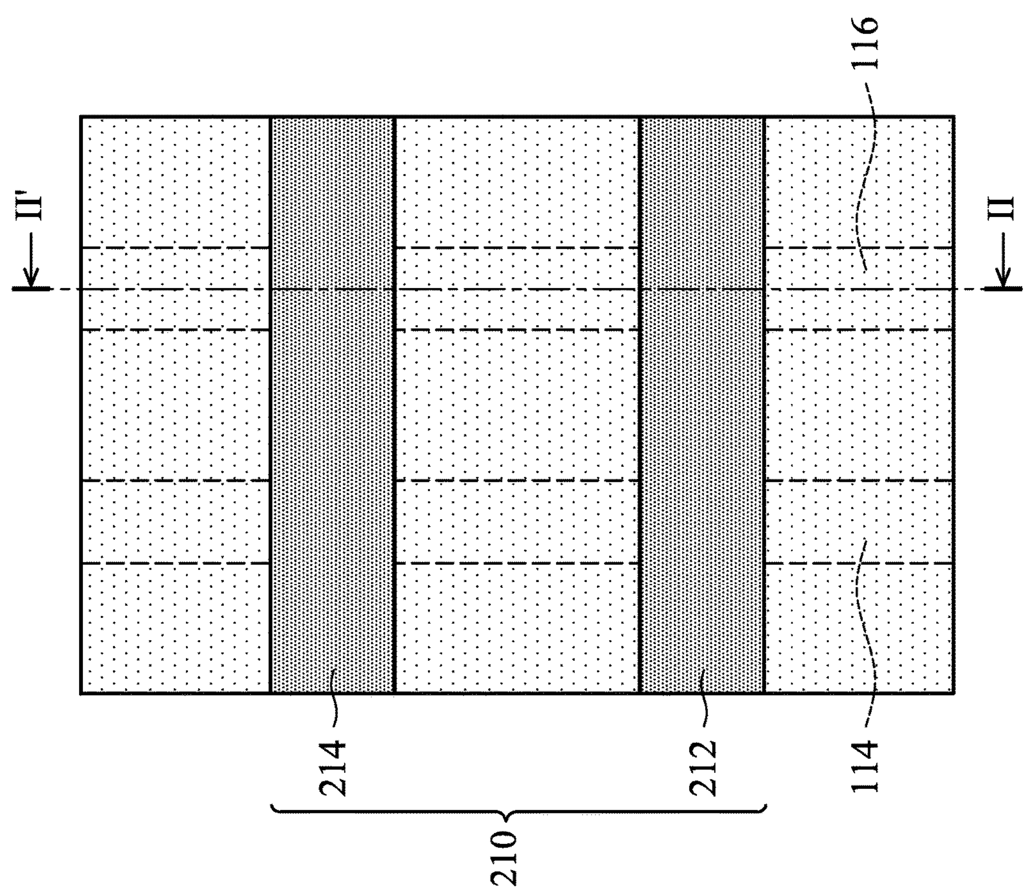

FIGS. 2A-2F are cross-sectional views of various stages of a process for forming the semiconductor device structure 200 after the step of FIG. 1F, in accordance with some embodiments. FIG. 2B-1 is a top view of the semiconductor device structure of FIG. 2B, in accordance with some embodiments. FIG. 2B is a cross-sectional view illustrating the semiconductor device structure along a sectional line II-II' in FIG. 2B-1, in accordance with some embodiments.

As shown in FIGS. 2B and 2B-1, a mask layer 210 is formed over the amorphous layer 170, in accordance with some embodiments. The mask layer 210 has strip portions 212 and 214, in accordance with some embodiments. The strip portions 212 and 214 are formed over and across the fin portions 114 and 116, in accordance with some embodiments.

Figure 2C:
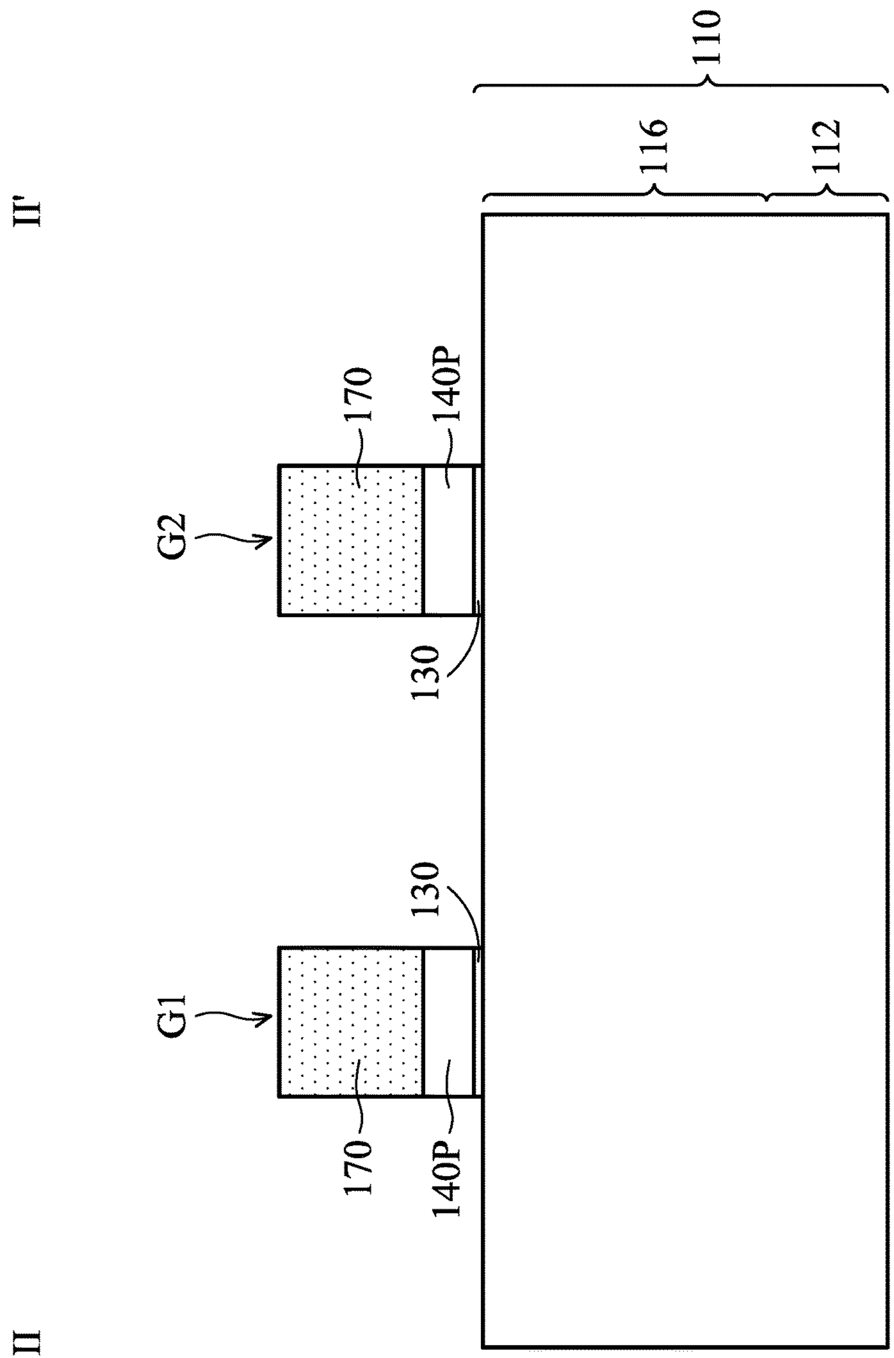
Figures 1, 2C:
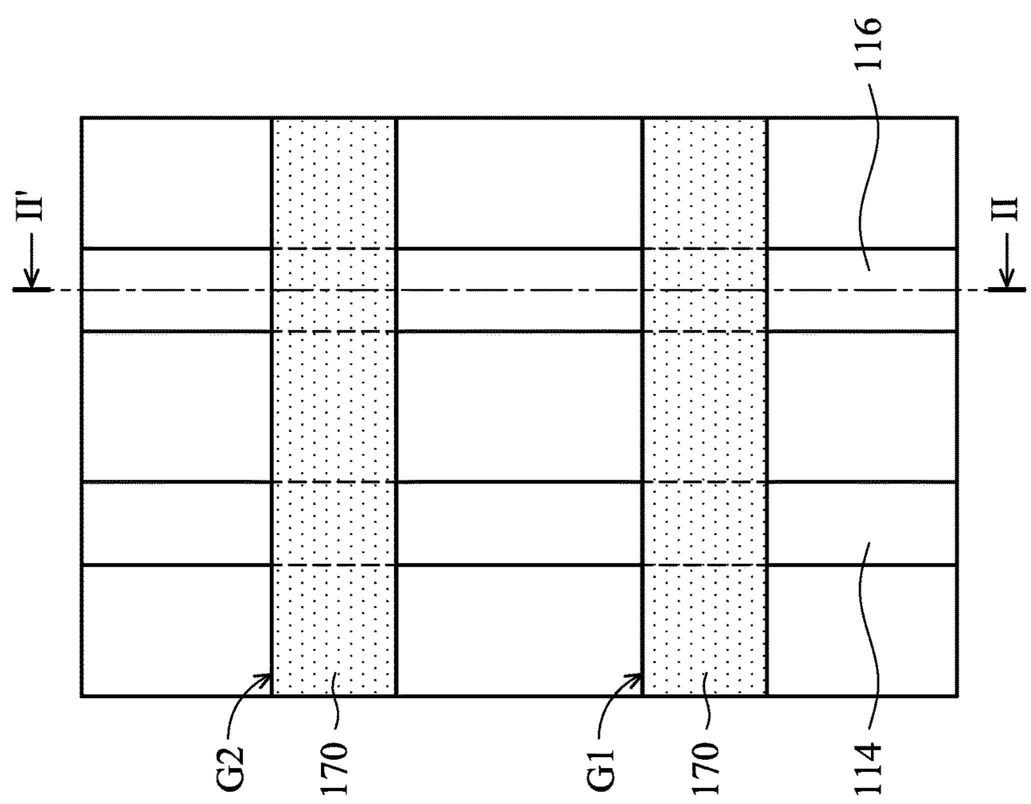
Figures 2, 2C:
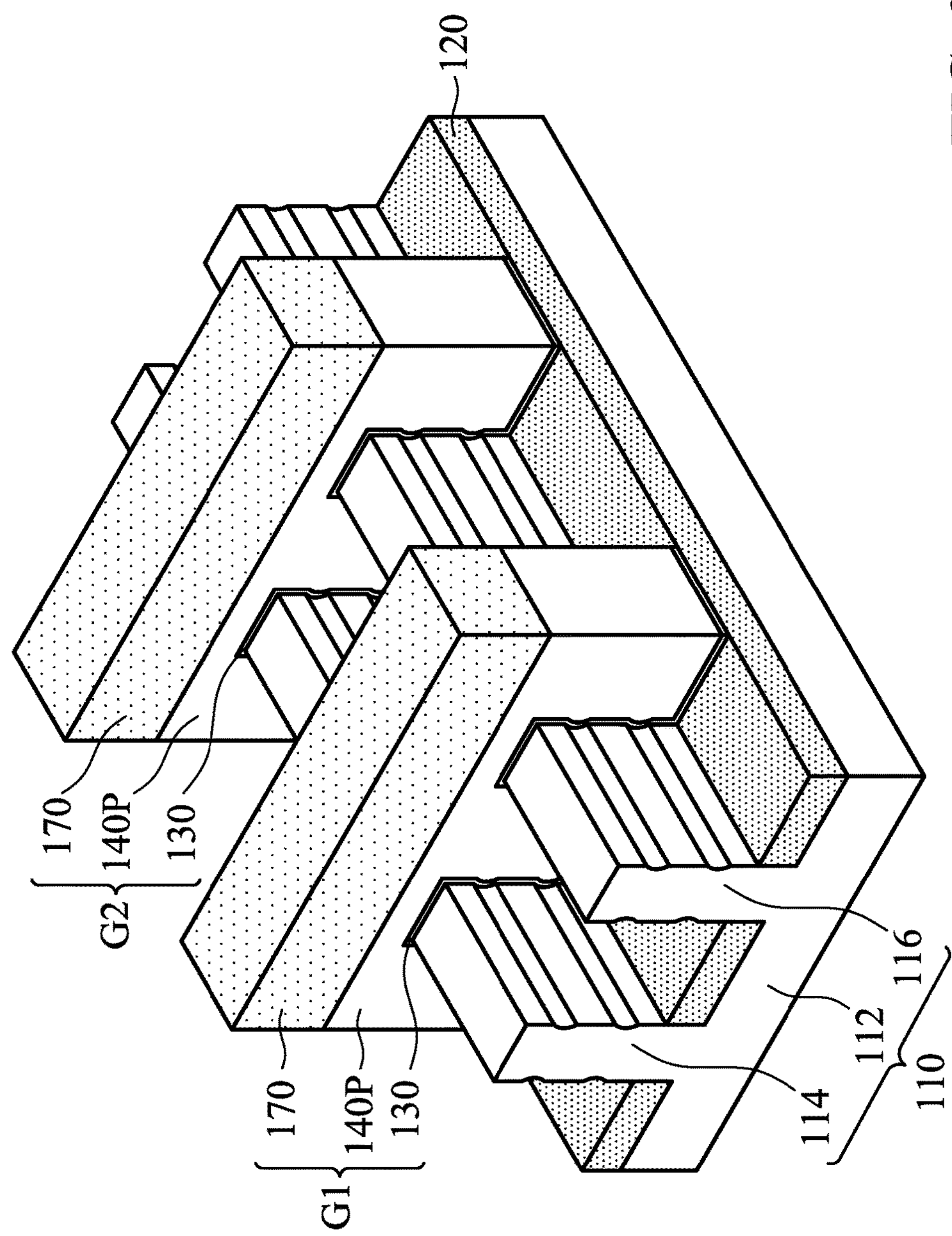

FIG. 2C-1 is a top view of the semiconductor device structure of FIG. 2C, in accordance with some embodiments. FIG. 2C is a cross-sectional view illustrating the semiconductor device structure along a sectional line II-II' in FIG. 2C-1, in accordance with some embodiments. FIG. 2C-2 is a perspective view of the semiconductor device structure of FIG. 2C, in accordance with some embodiments.

As shown in FIGS. 2B, 2C, 2C-1, and 2C-2, the amorphous layer 170 uncovered by the mask layer 210, the polycrystalline layer 140P uncovered by the mask layer 210, and the gate dielectric layer 130 uncovered by the mask layer 210 are removed, in accordance with some embodiments.

The amorphous layer 170, the polycrystalline layer 140P, and the gate dielectric layer 130 remaining under the strip portion 212 together form a gate structure G1, in accordance with some embodiments. The amorphous layer 170, the polycrystalline layer 140P, and the gate dielectric layer 130 remaining under the strip portion 214 together form a gate structure G2, in accordance with some embodiments. The gate structures G1 and G2 are formed over and across the fin portions 114 and 116, in accordance with some embodiments.

The removal process includes performing a first etching process on the amorphous layer 170 using the mask layer 210 as an etching mask; and then performing a second etching process on the polycrystalline layer 140P and the gate dielectric layer 130 using the etched amorphous layer 170 as an etching mask, in accordance with some embodiments. The process recipe of the first etching process is different from that of the second etching process, in accordance with some embodiments. As shown in FIGS. 2C, 2C-1, and 2C-2, the mask layer 210 is removed, in accordance with some embodiments.

If the average grain diameter is smaller, the etching yield will be better. Therefore, the yield of the first etching process on the amorphous layer 170 is good, which improves the yield of the second etching process on the polycrystalline layer 140P. Therefore, the critical dimension variation between the gate structures G1 and G2 is minimized, in accordance with some embodiments.

Figure 2D:
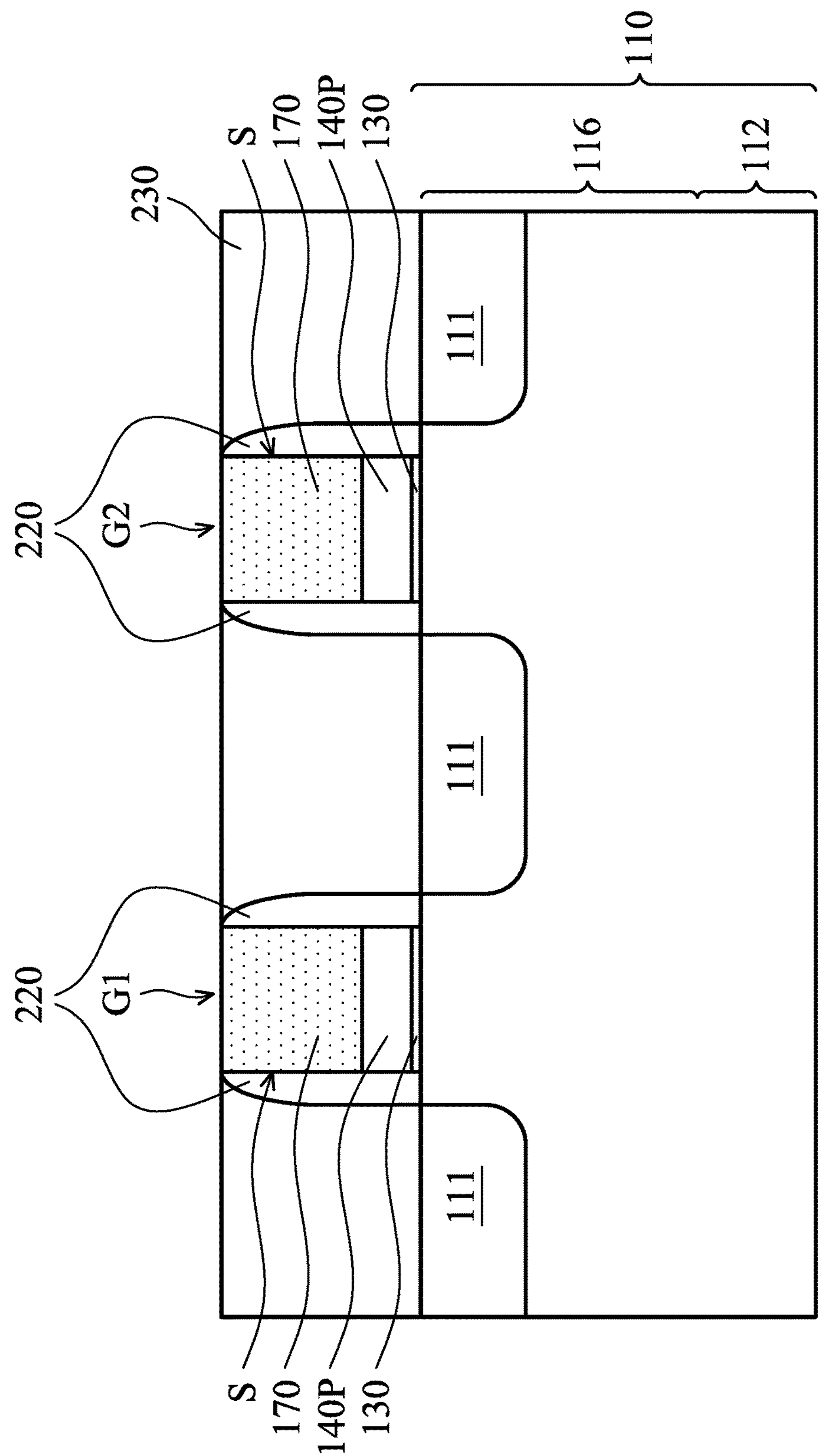

As shown in FIG. 2D, a spacer layer 220 is formed over sidewalls S of the gate structures G1 and G2, in accordance with some embodiments. The spacer layer 220 includes insulating materials, such as silicon oxide or silicon nitride, in accordance with some embodiments. The formation of the spacer layer 220 includes a deposition process and an anisotropic etching process, in accordance with some embodiments.

As shown in FIG. 2D, doped regions 111 are formed in the fin portions 114 and 116, in accordance with some embodiments. The formation of the doped regions 111 includes as an ion implantation process, in accordance with some embodiments. The ion implantation process is performed to introduce p-type impurities (e.g., boron) or n-type impurities (e.g., phosphorus) into the fin portions 114 and 116, in accordance with some embodiments. The doped regions 111 are a doped source region and a doped drain region, in accordance with some embodiments. The doped regions 111 are located at the two opposite sides of each gate structure G1 or G2, in accordance with some embodiments.

As shown in FIG. 2D, a dielectric layer 230 is formed over the substrate 110, the gate structures G1 and G2, and the spacer layer 220, in accordance with some embodiments. As shown in FIG. 2D, a planarization process is then performed on the dielectric layer 230 until top surfaces of the gate structures G1 and G2 are exposed, in accordance with some embodiments. The planarization process includes a chemical mechanical polishing (CMP) process, in accordance with some embodiments.

Figure 2E:
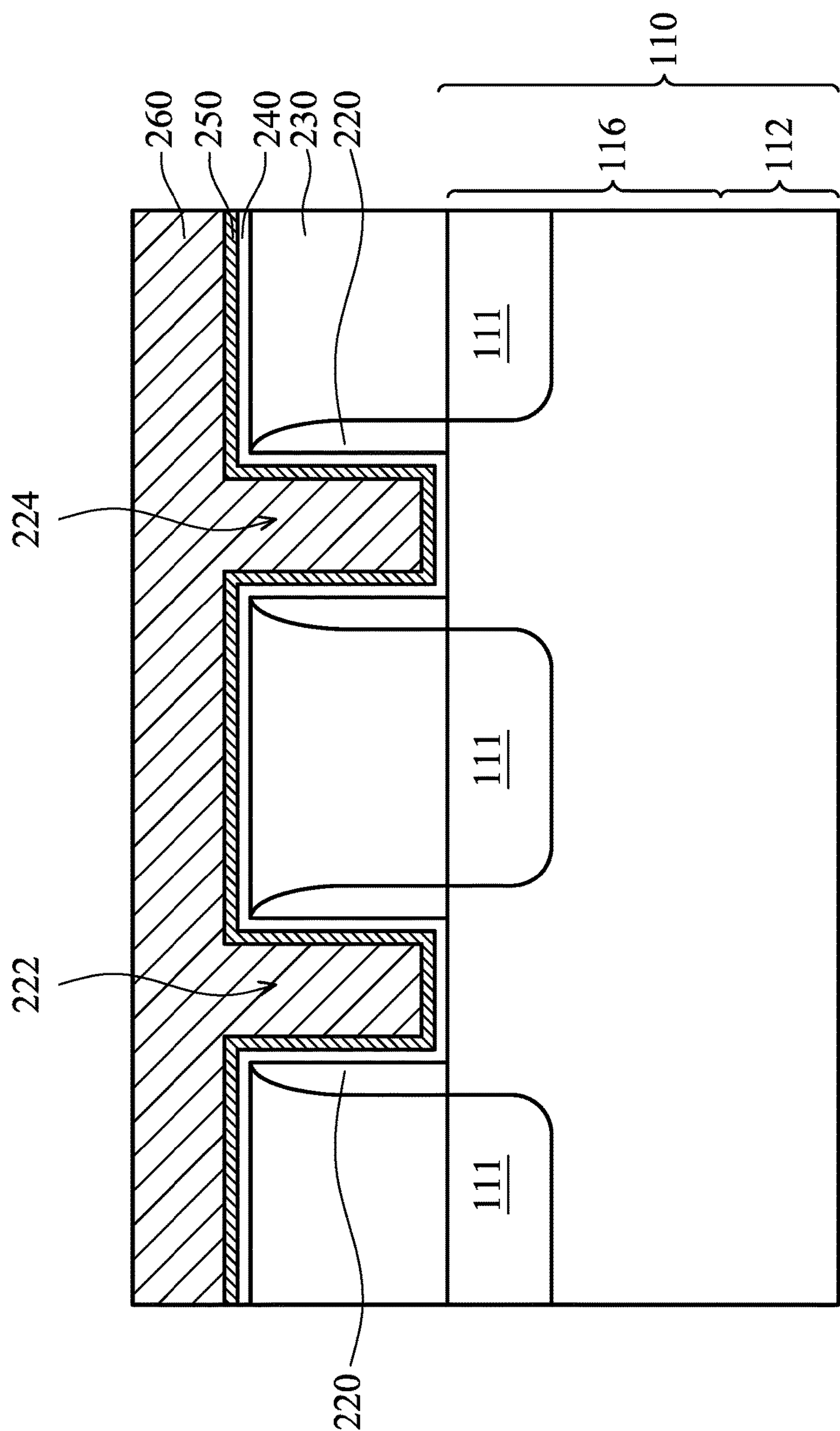

As shown in FIG. 2E, the gate structures G1 and G2 are removed, in accordance with some embodiments. The removal process includes a wet etching process and a dry etching process, in accordance with some embodiments. After the removal process, openings 222 and 224 are formed in the spacer layer 220, in accordance with some embodiments As shown in FIG. 2E, a gate dielectric layer 240 is formed to cover bottom surfaces of the openings 222 and 224, in accordance with some embodiments. Thereafter, a work function metal layer 250 is deposited over the gate dielectric layer 240, in accordance with some embodiments.

Afterwards, a gate electrode layer 260 (also called a metal gate electrode layer) is deposited over the work function metal layer 250 to fill the openings 222 and 224, in accordance with some embodiments. The gate electrode layer 260 is made of a suitable metal material, such as aluminum, tungsten, gold, platinum, cobalt, other suitable metal, an alloy thereof, or a combination thereof, in accordance with some embodiments.

Figure 2F:
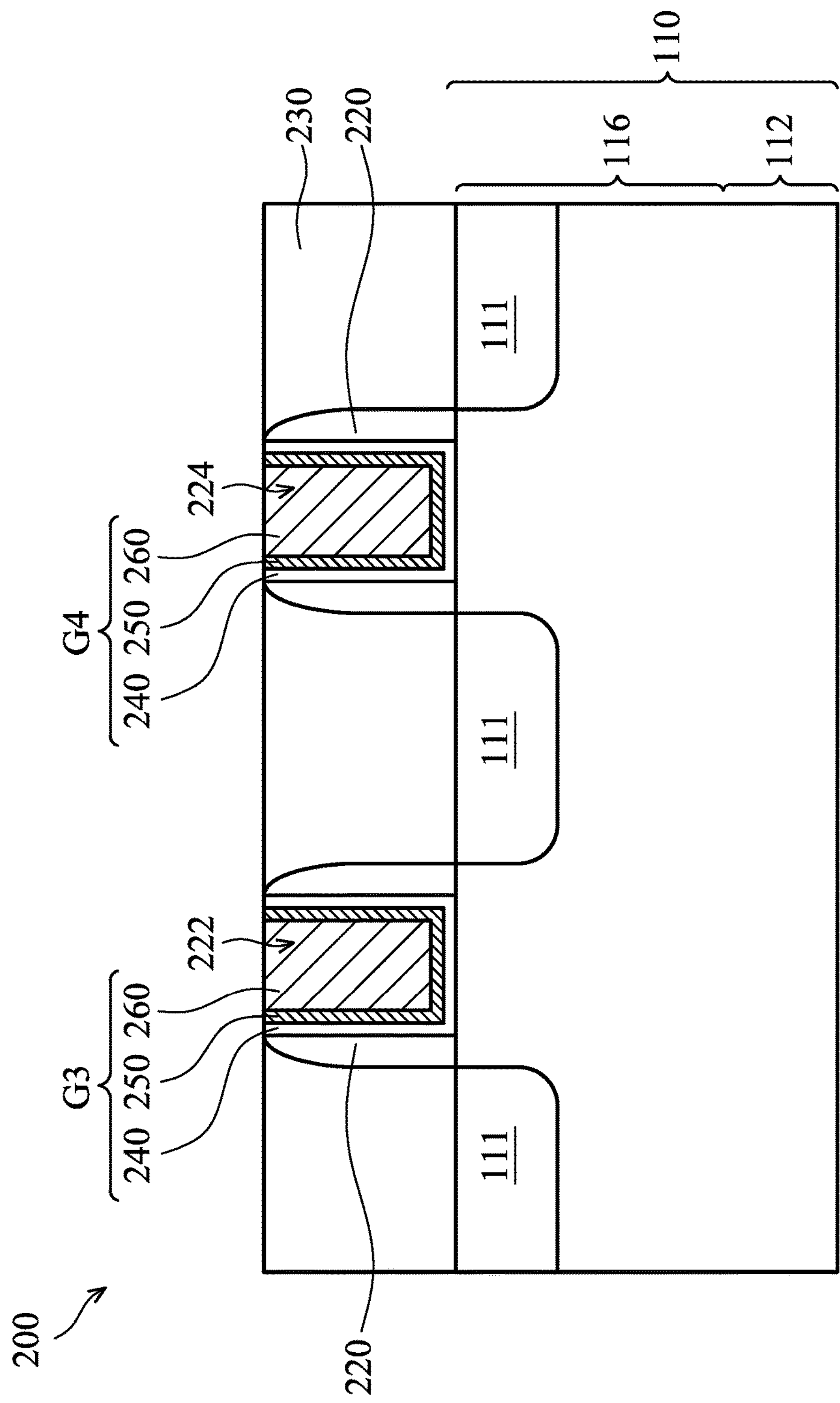
Figures 1, 2F:
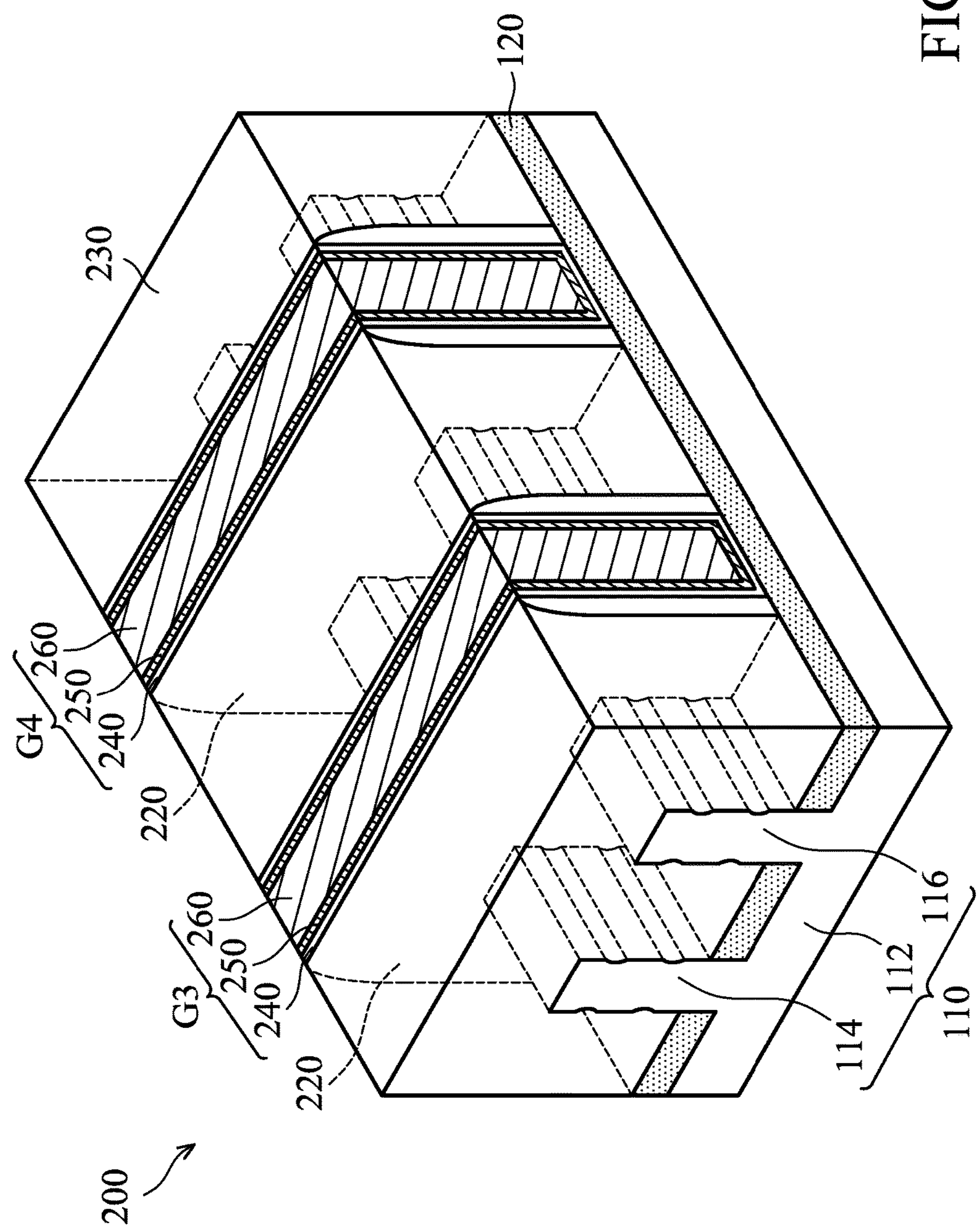

FIG. 2F-1 is a perspective view of the semiconductor device structure of FIG. 2F, in accordance with some embodiments. As shown in FIGS. 2F and 2F-1, a planarization process is performed to remove the gate electrode layer 260, the work function metal layer 250, and the gate dielectric layer 240 outside of the openings 222 and 224, in accordance with some embodiments.

In this step, a semiconductor device structure 200 is formed. In the semiconductor device structure 200, the gate electrode layer 260, the work function metal layer 250, and the gate dielectric layer 240 remaining in the opening 222 form a gate structure G3, in accordance with some embodiments. In the semiconductor device structure 200, the gate electrode layer 260, the work function metal layer 250, and the gate dielectric layer 240 remaining in the opening 224 form a gate structure G4, in accordance with some embodiments. The gate structures G3 and G4 are also referred to as metal gate structures, in accordance with some embodiments.

Since the critical dimension variation between the gate structures G1 and G2 of FIG. 2C is minimized, the critical dimension variation between the gate structures G3 and G4 of FIG. 2F is minimized as well. Therefore, the performance of the semiconductor device structure 200 is improved.

Figure 3A:
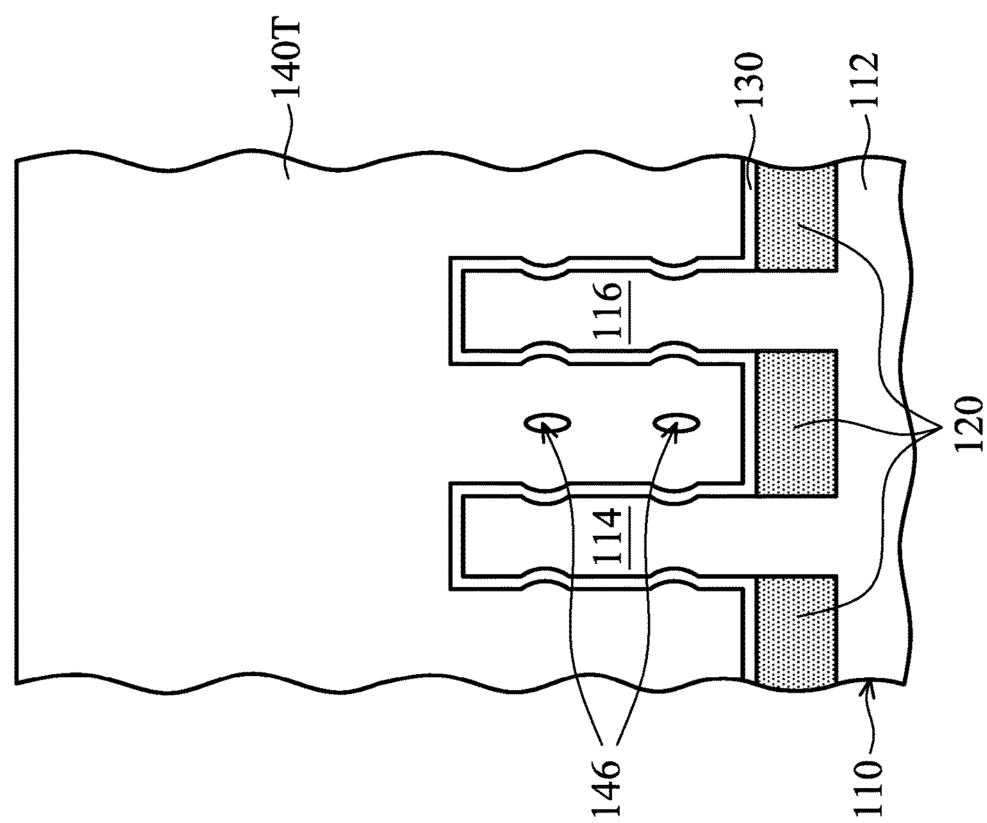
FIGS. 3A-3B are cross-sectional views of various stages of a process for forming a semiconductor device structure, in accordance with some embodiments.
Figure 3B:
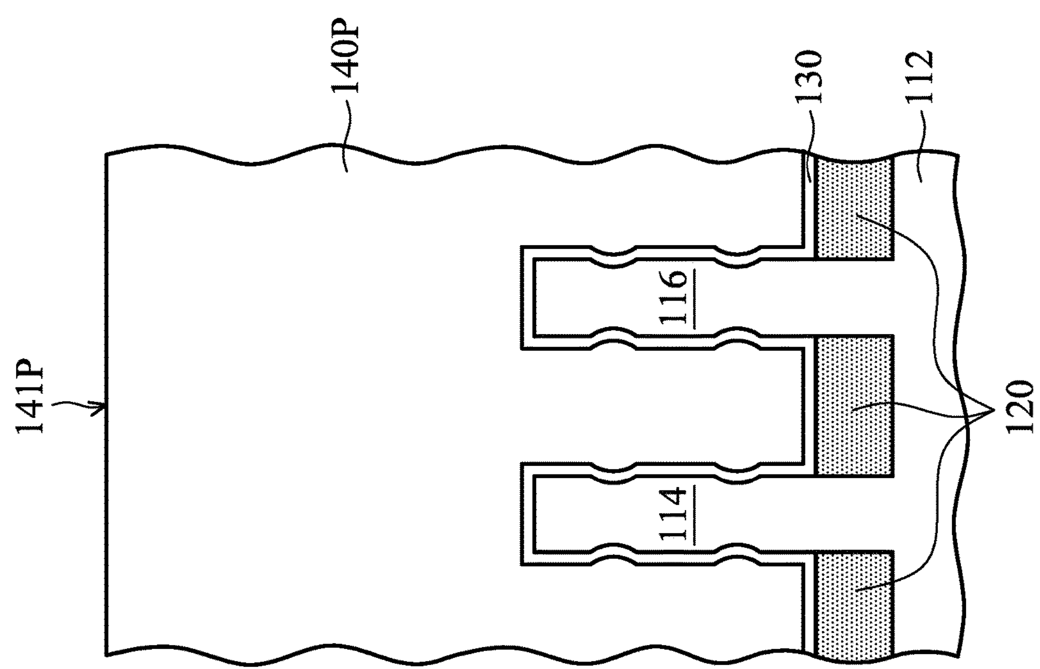

FIGS. 3A-3B are cross-sectional views of various stages of a process for forming a semiconductor device structure, in accordance with some embodiments.

As shown in FIG. 3A, after the step of FIG. 1C, the removal process of FIG. 1B and the deposition process of FIG. 1A are performed many times to form a thick amorphous layer 140T, in accordance with some embodiments.

As shown in FIG. 3B, an annealing process is performed on the thick amorphous layer 140T, in accordance with some embodiments. The first average grain diameter of the thick amorphous layer 140T is enlarged by the annealing process, in accordance with some embodiments.

The thick amorphous layer 140T is crystallized into a polycrystalline layer 140P by the annealing process, in accordance with some embodiments. The annealing temperature of the annealing process is greater than about 550° C., in accordance with some embodiments. The annealing temperature of the annealing process ranges from about 550° C. to about 1100° C., in accordance with some embodiments.

The annealing temperature of the annealing process is greater than the deposition temperature of the thick amorphous layer 140T, in accordance with some embodiments. Therefore, the flowability of the thick amorphous layer 140T may be improved by the annealing process. Some of the broken bonds of the semiconductor material constituting the thick amorphous layer 140T may be repaired during the annealing process. As a result, most of or all of the voids 146 (or seams) shrink or disappear after the annealing process, in accordance with some embodiments.

Thereafter, the step of FIG. 1F is performed to thin the polycrystalline layer 140P from a top surface 141P of the polycrystalline layer 140P, in accordance with some embodiments. The steps of FIGS. 1G-2F are performed to form the semiconductor device structure 200 of FIG. 2F, in accordance with some embodiments.

Figure 4A:
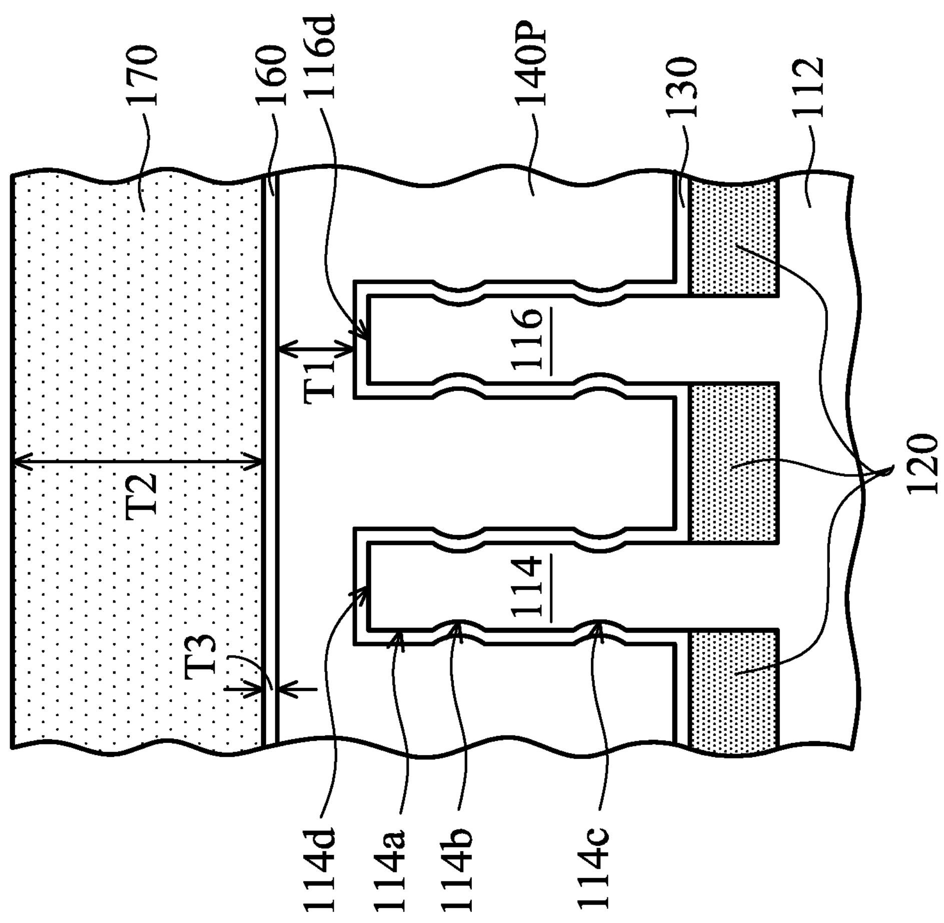
FIGS. 4A-4B are cross-sectional views of various stages of a process for forming a semiconductor device structure, in accordance with some embodiments.
Figure 4B:
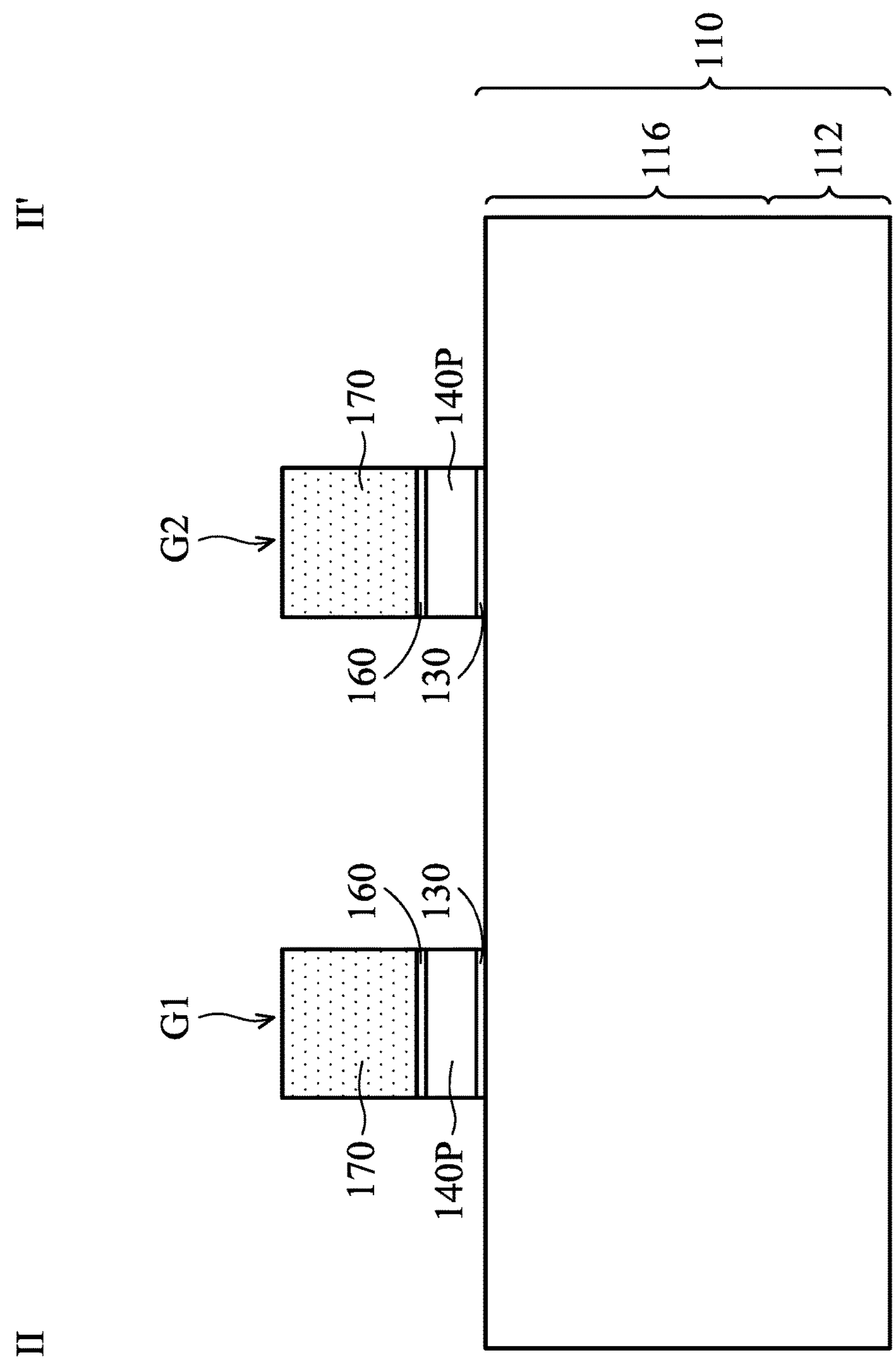
Figures 1, 4B:
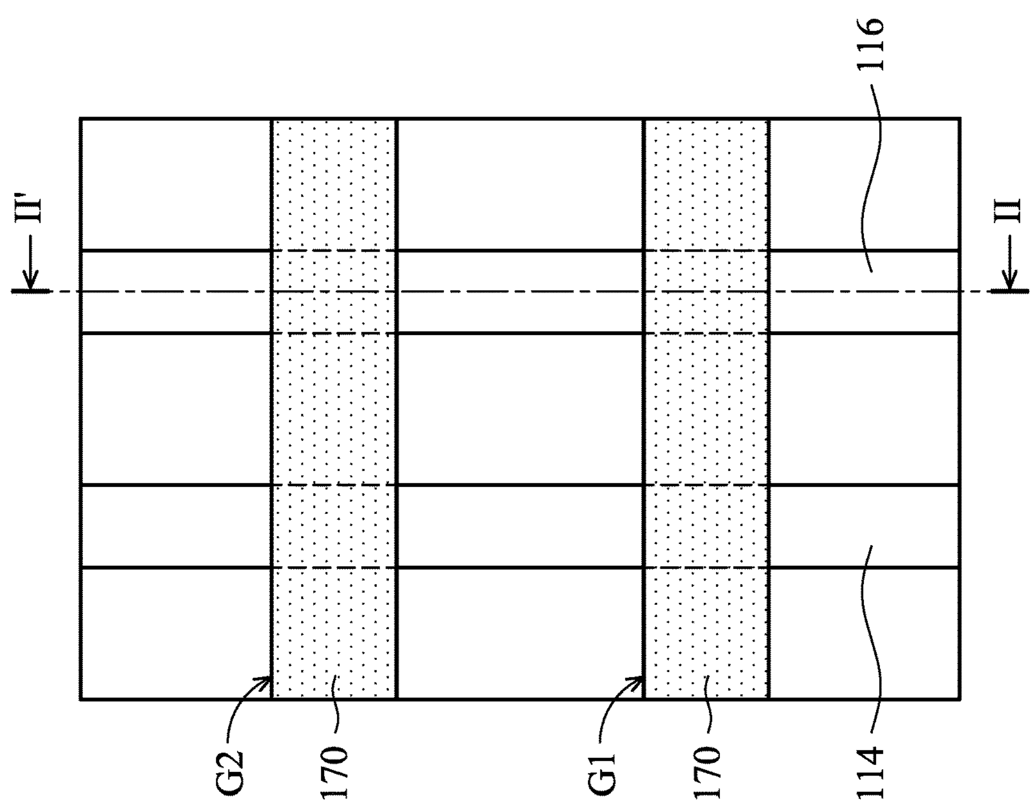

FIGS. 4A-4B are cross-sectional views of various stages of a process for forming a semiconductor device structure, in accordance with some embodiments. As shown in FIG. 4A, after the step of FIG. 1F, an amorphous layer 170 is formed over the semiconductor oxide layer 160, in accordance with some embodiments. The amorphous layer 170 is also referred to as a semiconductor layer, in accordance with some embodiments.

The amorphous layer 170 is in direct contact with the semiconductor oxide layer 160, in accordance with some embodiments. The thickness T1 of the polycrystalline layer 140P over the top surface 116*d* of the fin portion 116 is less than a thickness T2 of the amorphous layer 170, in accordance with some embodiments. The thickness T1 is greater than a thickness T3 of the semiconductor oxide layer 160, in accordance with some embodiments. An average grain diameter of the amorphous layer 170 is less than an average grain diameter of the polycrystalline layer 140P, in accordance with some embodiments.

The amorphous layer 170 includes a semiconductor material, such as Si, SiGe, or Ge, in accordance with some embodiments. The amorphous layer 170 is formed using a chemical vapor deposition (CVD) process, such as a low pressure chemical vapor deposition (LPCVD) process or a plasma enhanced chemical vapor deposition (PECVD) process, in accordance with some embodiments. The deposition temperature of the deposition process ranges from about 350° C. to about 550° C., in accordance with some embodiments.

As shown in FIG. 4B, after the steps of FIGS. 2B-2C, portions of the amorphous layer 170, the semiconductor oxide layer 160, the polycrystalline layer 140P, and the gate dielectric layer 130 are removed, in accordance with some embodiments. Thereafter, the steps of FIGS. 2D-2F are performed to form the semiconductor device structure 200 of FIG. 2F, in accordance with some embodiments.

In accordance with some embodiments, semiconductor device structures and methods for forming the same are provided. The methods (for forming the semiconductor device structure) include annealing a first amorphous layer over a fin into a polycrystalline layer; forming a second amorphous layer over the polycrystalline layer; and etching the second amorphous layer and the polycrystalline layer to remove portions of the second amorphous layer and the polycrystalline layer so as to form a gate structure over and across the fin. The annealing process may reduce, eliminate, or fill the voids (or seams) in the first amorphous layer. The second amorphous layer has a small average grain diameter, and therefore the yield of the etching process is improved.

In accordance with some embodiments, a method for forming a semiconductor device structure is provided. The method includes forming a first amorphous layer over a substrate. The substrate has a base portion and a first fin portion over the base portion, and the first amorphous layer covers the first fin portion. The method includes annealing the first amorphous layer to crystallize the first amorphous layer into a first polycrystalline layer. The method includes forming a second amorphous layer over the first polycrystalline layer. The method includes removing a first portion of the second amorphous layer and a second portion of the first polycrystalline layer under the first portion. The remaining second amorphous layer and the remaining first polycrystalline layer together form a first gate structure over and across the first fin portion.

In accordance with some embodiments, a method for forming a semiconductor device structure is provided. The method includes forming an amorphous layer over a substrate. The substrate has a base portion and a fin portion over the base portion, and the amorphous layer covers the fin portion. The method includes annealing the amorphous layer to crystallize the amorphous layer into a first polycrystalline layer. The method includes forming a semiconductor layer over the first polycrystalline layer, wherein a first average grain diameter of the semiconductor layer is less than a second average grain diameter of the first polycrystalline layer. The method includes removing a first portion of the semiconductor layer and a second portion of the first polycrystalline layer under the first portion. The remaining semiconductor layer and the remaining first polycrystalline layer under the remaining semiconductor layer together form a first gate structure over and across the fin portion.

In accordance with some embodiments, a method for forming a semiconductor device structure is provided. The method includes forming a first semiconductor layer over a substrate. The substrate has a base portion and a fin portion over the base portion, the first semiconductor layer covers the fin portion, and the first semiconductor layer has a first average grain diameter. The method includes performing an annealing process on the first semiconductor layer. The first average grain diameter is enlarged by the annealing process. The method includes after the annealing process, forming a second semiconductor layer over the first semiconductor layer. A second average grain diameter of the second semiconductor layer is less than the enlarged first average grain diameter of the first semiconductor layer. The method includes removing a first portion of the second semiconductor layer and a second portion of the first semiconductor layer under the first portion. The remaining second semiconductor layer and the remaining first semiconductor layer under the remaining second semiconductor layer together form a gate structure over and across the fin portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a first amorphous layer over a substrate, wherein the substrate has a base portion and a first fin portion over the base portion, and the first amorphous layer covers the first fin portion;

annealing the first amorphous layer to crystallize the first amorphous layer into a first polycrystalline layer;

forming a second amorphous layer over the first polycrystalline layer; and removing a first portion of the second amorphous layer and a second portion of the first polycrystalline layer under the first portion, wherein the remaining second amorphous layer and the remaining first polycrystalline layer together form a first gate structure over and across the first fin portion.

2. The method for forming a semiconductor device structure as claimed in claim 1, further comprising:

before the annealing of the first amorphous layer, forming a second polycrystalline layer over the first amorphous layer; and after the annealing of the first amorphous layer, removing the second polycrystalline layer and an upper portion of the first polycrystalline layer.

3. The method for forming a semiconductor device structure as claimed in claim 1, wherein the first fin portion has a top surface, and a first thickness of the first polycrystalline layer over the top surface is less than a second thickness of the second amorphous layer.

4. The method for forming a semiconductor device structure as claimed in claim 1, further comprising:

after the annealing of the first amorphous layer, thinning the first polycrystalline layer from a top surface of the first polycrystalline layer.

5. The method for forming a semiconductor device structure as claimed in claim 1, wherein the first fin portion has a first sidewall, and the first sidewall has a first recess.

6. The method for forming a semiconductor device structure as claimed in claim 5, wherein the substrate further has a second fin portion, the second fin portion has a second sidewall facing the first sidewall, the second sidewall has a second recess, and the first amorphous layer further covers the second fin portion and has a void between the first recess and the second recess.

7. The method for forming a semiconductor device structure as claimed in claim 6, wherein the forming of the first amorphous layer comprises:

depositing a first amorphous material layer over the substrate to cover the first fin portion and the second fin portion;

removing a portion of the first amorphous material layer between the first fin portion and the second fin portion; and depositing a second amorphous material layer over the first amorphous material layer.

8. The method for forming a semiconductor device structure as claimed in claim 1, further comprising:

after the formation of the first gate structure, forming a spacer layer over sidewalls of the first gate structure;

forming a dielectric layer over the substrate and surrounding the first gate structure and the spacer layer;

removing the first gate structure, wherein an opening is formed in the spacer layer after the removing of the first gate structure; and forming a second gate structure in the opening.

9. The method for forming a semiconductor device structure as claimed in claim 1, further comprising:

before the forming of the second amorphous layer, forming a semiconductor oxide layer over the first polycrystalline layer, wherein the second amorphous layer is formed over the semiconductor oxide layer, and the removing of the first portion and the second portion further comprises removing the semiconductor oxide layer between the first portion and the second portion.

10. The method for forming a semiconductor device structure as claimed in claim 1, further comprising:

before the forming of the second amorphous layer, forming a semiconductor oxide layer over the first polycrystalline layer; and removing the semiconductor oxide layer, wherein the second amorphous layer is in direct contact with the first polycrystalline layer.

11. A method for forming a semiconductor device structure, comprising:

forming an amorphous layer over a substrate, wherein the substrate has a base portion and a fin portion over the base portion, and the amorphous layer covers the fin portion;

annealing the amorphous layer to crystallize the amorphous layer into a first polycrystalline layer;

before the annealing of the amorphous layer, forming a second polycrystalline layer over the amorphous layer;

forming a semiconductor layer over the first polycrystalline layer, wherein a first average grain diameter of the semiconductor layer is less than a second average grain diameter of the first polycrystalline layer; and removing a first portion of the semiconductor layer and a second portion of the first polycrystalline layer under the first portion, wherein the remaining semiconductor layer and the remaining first polycrystalline layer under the remaining semiconductor layer together form a first gate structure over and across the fin portion.

12. The method for forming a semiconductor device structure as claimed in claim 11, further comprising:

after the annealing of the amorphous layer, removing the second polycrystalline layer and an upper portion of the first polycrystalline layer.

13. The method for forming a semiconductor device structure as claimed in claim 11, wherein the fin portion has a top surface, and a first thickness of the first polycrystalline layer over the top surface is less than a second thickness of the semiconductor layer.

14. The method for forming a semiconductor device structure as claimed in claim 11, further comprising:

after the formation of the first gate structure, forming a spacer layer over sidewalls of the first gate structure;

forming a dielectric layer over the substrate and surrounding the first gate structure and the spacer layer;

removing the first gate structure, wherein an opening is formed in the spacer layer after the removing of the first gate structure; and forming a second gate structure in the opening.

15. A method for forming a semiconductor device structure, comprising:

forming a first semiconductor layer over a substrate, wherein the substrate has a base portion and a fin portion over the base portion, the first semiconductor layer covers the fin portion, and the first semiconductor layer has a first average grain diameter;

performing an annealing process on the first semiconductor layer, wherein the first average grain diameter is enlarged by the annealing process;

after the annealing process, forming a second semiconductor layer over the first semiconductor layer, wherein a second average grain diameter of the second semiconductor layer is less than the enlarged first average grain diameter of the first semiconductor layer; and removing a first portion of the second semiconductor layer and a second portion of the first semiconductor layer under the first portion, wherein the remaining second semiconductor layer and the remaining first semiconductor layer under the remaining second semiconductor layer together form a gate structure over and across the fin portion, wherein the removing of the first portion and the second portion comprises:

performing a first etching process on the second semiconductor layer to remove the first portion, wherein the second portion of the first semiconductor layer under the first portion is exposed after the first etching process; and after the first etching process, performing a second etching process on the first semiconductor layer using the second semiconductor layer as an etching mask to remove the second portion.

16. The method for forming a semiconductor device structure as claimed in claim 15, further comprising:

before the forming of the second semiconductor layer, forming a semiconductor oxide layer over the first semiconductor layer, wherein the second semiconductor layer is formed over the semiconductor oxide layer, and the removing of the first portion and the second portion further comprises removing the semiconductor oxide layer between the first portion and the second portion.

17. The method for forming a semiconductor device structure as claimed in claim 15, further comprising:

before the forming of the second semiconductor layer, forming a semiconductor oxide layer over the first semiconductor layer; and removing the semiconductor oxide layer, wherein the second semiconductor layer is in direct contact with the first semiconductor layer.

18. The method for forming a semiconductor device structure as claimed in claim 15, further comprising:

after the annealing of the first semiconductor layer, thinning the first semiconductor layer from a top surface of the first semiconductor layer.

19. The method for forming a semiconductor device structure as claimed in claim 1, wherein the substrate further has a second fin portion, and the first amorphous layer further covers the second fin portion and has a void between the first fin portion and the second fin portion.

20. The method for forming a semiconductor device structure as claimed in claim 1, wherein the removing of the first portion and the second portion comprises:

performing a first etching process on the second amorphous layer to remove the first portion, wherein the second portion of the first polycrystalline layer under the first portion is exposed after the first etching process; and after the first etching process, performing a second etching process on the first polycrystalline layer using the second amorphous layer as an etching mask to remove the second portion.

* * * * *